US010609814B2

(12) United States Patent
Chandra et al.

(10) Patent No.: US 10,609,814 B2
(45) Date of Patent: Mar. 31, 2020

(54) DIFFERENTIAL TRACE PAIR SYSTEM

(71) Applicant: Dell Products L.P., Round Rock, TX (US)

(72) Inventors: Umesh Chandra, Santa Cruz, CA (US); Bhyrav M. Mutnury, Austin, TX (US)

(73) Assignee: Dell Products LLP, Round Rock, TX (US)

( * ) Notice: Subject to any disclaimer, the term of this patent is extended or adjusted under 35 U.S.C. 154(b) by 0 days.

(21) Appl. No.: 16/414,078

(22) Filed: May 16, 2019

(65) Prior Publication Data

US 2019/0297721 A1   Sep. 26, 2019

Related U.S. Application Data

(63) Continuation of application No. 15/927,668, filed on Mar. 21, 2018, now Pat. No. 10,299,370.

(51) Int. Cl.
*H05K 1/02* (2006.01)
*H05K 1/11* (2006.01)

(52) U.S. Cl.
CPC .......... *H05K 1/025* (2013.01); *H05K 1/0216* (2013.01); *H05K 1/0245* (2013.01); *H05K 1/111* (2013.01); *H05K 1/0225* (2013.01); *H05K 1/0298* (2013.01); *H05K 2201/09227* (2013.01); *H05K 2201/09727* (2013.01); *H05K 2201/10189* (2013.01)

(58) Field of Classification Search
USPC ........................................................ 361/748
See application file for complete search history.

(56) References Cited

U.S. PATENT DOCUMENTS

| 2005/0202722 | A1* | 9/2005 | Regnier | ............... | H05K 1/0222 |
| | | | | | 439/607.05 |
| 2013/0199834 | A1 | 8/2013 | De Geest et al. | | |
| 2014/0209370 | A1 | 7/2014 | Minich | | |

* cited by examiner

*Primary Examiner* — Andargie M Aychillhum
(74) *Attorney, Agent, or Firm* — Haynes and Boone, LLP

(57) ABSTRACT

A differential trace pair system includes a first conductive layer that is located immediately adjacent a first insulating layer. The system includes a second conductive layer that is located immediately adjacent the first insulating layer and opposite the first insulating layer from the first conductive layer, and includes an aperture that extends through the second conductive layer. A second insulating layer is located immediately adjacent the second conductive layer and opposite the second conductive layer from the first insulating layer. The system includes a first differential trace pair that is included in the second insulating layer and that includes a first differential trace that is positioned adjacent the aperture and references the second conductive layer, and a second differential trace that is longer than the first differential trace and that includes a first portion that is positioned adjacent the second conductive layer aperture and references the first conductive layer.

17 Claims, 9 Drawing Sheets

DIFFERENTIAL TRACE PAIR SYSTEM

CROSS-REFERENCE TO RELATED APPLICATIONS

This is a Continuation application to U.S. Utility application Ser. No. 15/927,668 filed Mar. 21, 2018, entitled "DIFFERENTIAL TRACE PAIR SYSTEM," the disclosure of which is incorporated herein by reference in its entirety.

BACKGROUND

The present disclosure relates generally to information handling systems, and more particularly to a differential trace pair system used in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switches, servers, and/or other computing devices typically include circuit boards with communication traces that are connected to different subsystems in order to provide for the transmission of information between those subsystems. For example, a differential trace pair may be provided between a transmitter subsystem and a receiver subsystem in the switch or server (or between different switches and/or servers) in order allow those subsystems to transmit and receive information. In some situations, the differential trace pair may couple to the transmitter subsystem and/or the receiver subsystem at connectors such as, for example, a pin included in a pin field (e.g., a Ball Grid Array (BGA) pin field.) The routing of differential trace pairs through such connectors can cause issues with the differential trace pair due to the connector arrangement, the placement of the differential trace pair, the angle of routing, and/or other differential trace pair routing characteristics known in the art. One of the common issues encountered in routing differential trace pairs in these and similar situations is when that routing results in one of the traces in the differential trace pair being longer than the other. This mismatch of trace length may cause common mode noise where a signal sent from the transmitter subsystem on the shorter trace in the differential trace pair arrives at the receiver subsystem before the signal that was sent from the transmitter subsystem on the longer trace in the differential trace pair. This problem is amplified as signal speeds increase beyond 25 Gbps, as the resulting common mode noise cannot be ignored, and issues associated with increased insertion and return loss are introduced.

Conventional systems attempt to remedy this issue by flipping the polarity at the receiver subsystem end of the differential trace pair such that the shorter trace leaving the transmitter subsystem end of the differential trace pair becomes the longer trace entering the receiver subsystem end of the differential trace pair. However, such solutions result in common mode noise throughout the routing of the differential trace pair, and are not possible on all system designs. Another conventional method for compensating for such differing trace lengths is to provide a serpentine trace region in the shorter trace that increases the length of the shorter trace to match that of the longer trace. The serpentine region length matching of the traces in the differential trace pair solves the common mode noise issue discussed above, but as signal speeds are increased to over 25 Gbps (e.g., 32 Gbps to 50/56 Gbps and beyond), the serpentine region length matching approach produces signal integrity issues. For example, when the shorter trace moves away from the longer trace in the serpentine region of the differential trace pair, an increase in impedance can occur (e.g., increases in impedance of 7-15 ohms have been observed depending on the stack-up cross-section and the material of the circuit board), resulting in high signal speed reflections and losses. Furthermore, in "tightly packed" printed circuit boards, the serpentine trace region may decrease the distance between the trace with the serpentine region and an adjacent single trace, or a trace of an adjacent differential trace pair, such that crosstalk coupling between the trace with the serpentine region and the adjacent trace may occur. Crosstalk is a phenomenon in which signal integrity is compromised when adjacent differential trace pairs are switching and noise from one differential trace pair couples to an adjacent differential trace pair or single trace.

Accordingly, it would be desirable to provide differential trace pairs with improved crosstalk performance.

SUMMARY

According to one embodiment, an information handling system (IHS) includes a processor; a circuit board having a connection pad array that couples the processor to the circuit board, wherein the connection pad array includes a first connection pad, a second connection pad, a third connection pad, and a fourth connection pad, and wherein the circuit board includes: a first insulating layer; a first conductive layer that is located immediately adjacent the first insulating layer; a second conductive layer that is located immediately adjacent the first insulating layer and opposite the first insulating layer from the first conductive layer, wherein the second conductive layer includes a second conductive layer aperture that extends through the second conductive layer; a second insulating layer that is located immediately adjacent the second conductive layer and opposite the second conductive layer from the first insulating layer, wherein the second conductive layer aperture provides for the engagement of the first insulating layer and the second insulating layer; and a first differential trace pair that is included in the second insulating layer such that the first differential trace pair is spaced apart from the second conductive layer, wherein first differential trace pair includes: a first differential trace that extends between the first connection pad and the second connection pad, is positioned adjacent the second conductive layer, and configured to reference to the second conductive layer; and a second differential trace that extends between the third connection pad and the fourth connection pad, is longer than the first differential trace, and that includes a first portion that is positioned adjacent the second conductive layer aperture and configured to reference to the first conductive layer.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
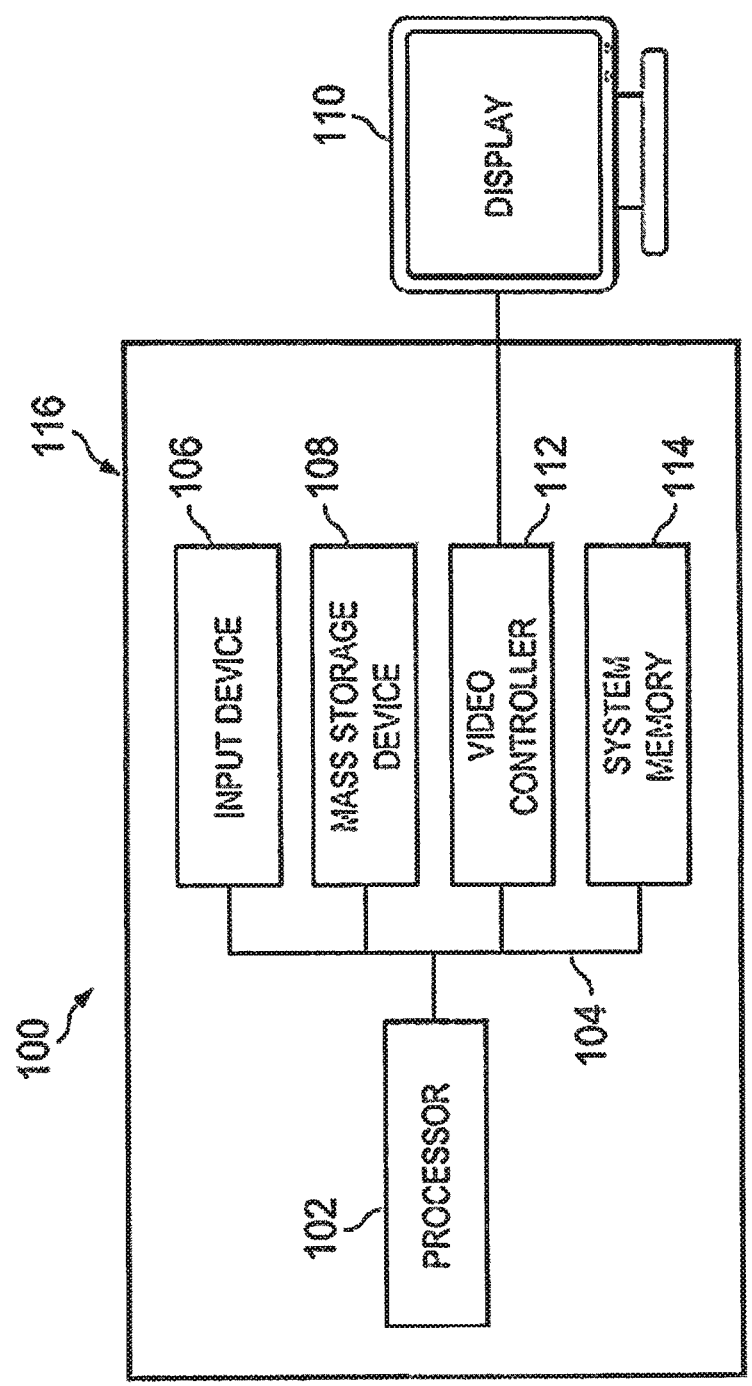
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
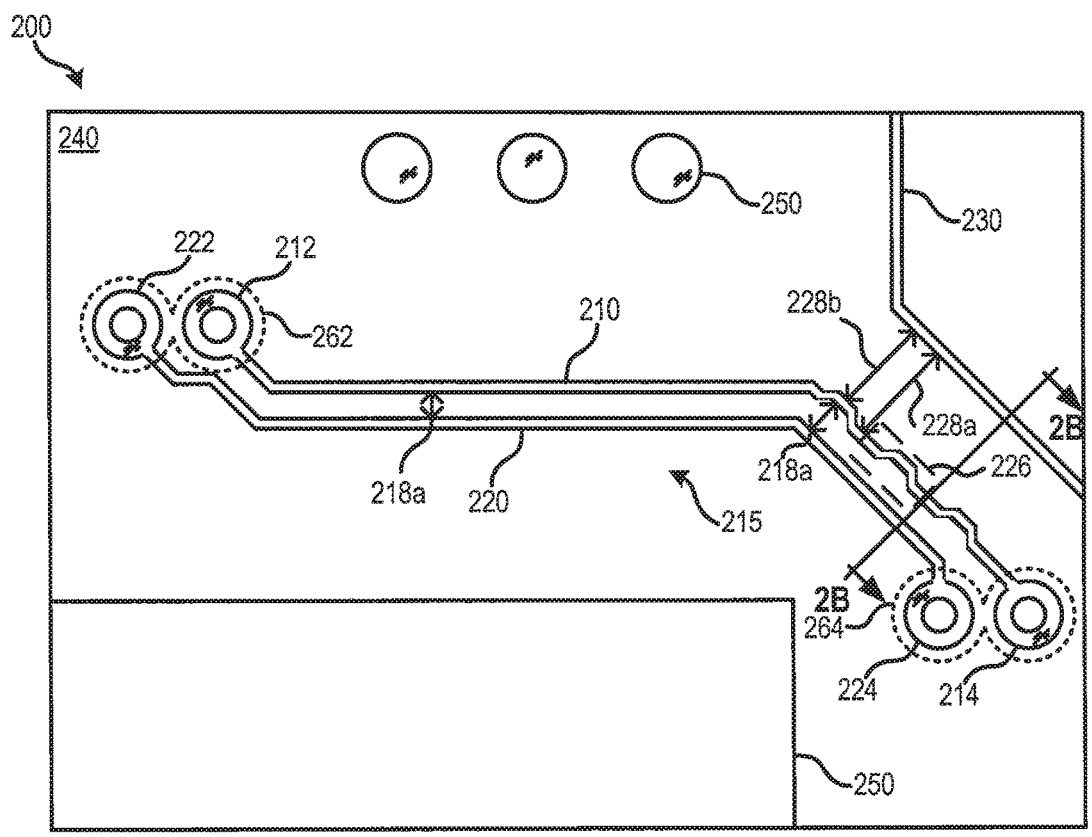
FIG. 2A is a schematic, plan view illustrating a conventional differential trace pair system.
Figure 2B:
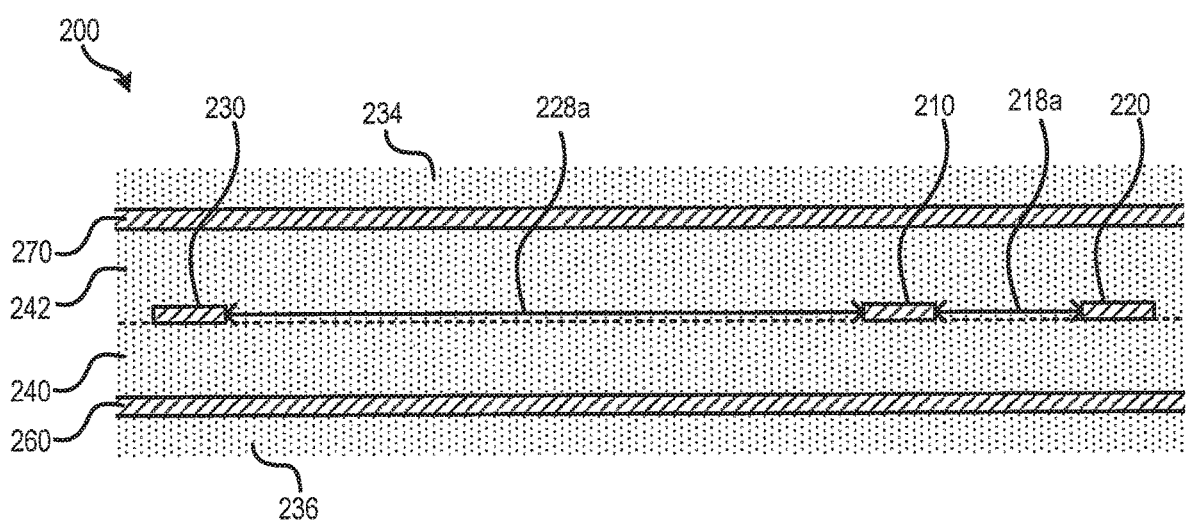
FIG. 2B is a cross-sectional view of the conventional differential trace pair system of FIG. 2A along plane 2B.

FIGS. 2A and 2B illustrate a conventional circuit board portion 200 containing some common structures found within the internal layers of a conventional printed circuit board. For example, the circuit board portion 200 may be provided in the IHS 100 discussed above with reference to FIG. 1, and/or in one or more components of the IHS 100. The cross-section of FIG. 2B shows three traces 210, 220, 230 located on a common conductive layer, along with four dielectric layers 234, 236, 240, and 242, and conductive planes 260 and 270. It is understood that other layers above and below these layers may exist in a complete circuit board. The plan view of FIG. 2A shows only the traces 210, 220, and 230, as well as the dielectric layer 240, and one of skill in the art will recognize that the conductive plane layer 260 may be located in circuit board portion 200 coextensive with dielectric layer 240, except for the clearances 262 and 264, indicated by hidden lines, in which the conductive plane layer 260 has been removed so that it does not short to plated through-holes co-located with pads 212, 222, 214, and 224.

In the example illustrated in FIGS. 2A and 2B, traces 210 and 220 form a differential trace pair 215. The differential trace pair 215 receives a signal pair at through-holes connected to pads 212 and 222, and is configured to propagate the signal pair to another pair of through-holes co-located with pads 214 and 224. Signals transmitted via the signal pair are differential with respect to the conductive planes 260 and 270. At any point along the traces 210 and 220, the voltage on trace 210 will have approximately the opposite polarity and the same magnitude as the voltage on trace 220, as referenced to the voltage on conductive planes 260 and 270. The impedance of the configuration is determined by the differential coupling of the electromagnetic (EM) fields between the two traces 210 and 220, and the single-ended coupling of each trace 210 and 220 to conductive planes 260 and 270. The spacing 218 between the traces 210 and 220, the spacing between the traces 210 and 220 (i.e., the "trace layer") and the conductive planes 260 and 270, and the trace size are configured to achieve a desired characteristic impedance. Such trace pairs are commonly used to transmit high-speed signals (digital symbol transmission rates greater than 1 billion symbols/second) between a source component and a receiver component.

In the example illustrated in FIGS. 2A and 2B, trace 230 is a single-ended trace that is routed such that it is spaced apart a distance from the differential pair 215 and other conductors (not shown) to produce a characteristic impedance that is dominated by its single-ended coupling to conductive planes 260 and 270. Such single-ended traces are generally used for lower-speed signals in which the high speed performance of a differential pair is not required, and/or to reduce space and component requirements. FIG. 2A also illustrates one or more board structures 250 that may be, for example, mounting structures for a processing system (e.g., a processing system that includes the processor 102 discussed above with reference to FIG. 1) and/or a memory system (e.g., a memory system that includes the memory 114 discussed above with reference to FIG. 1), airflow openings configured to ensure cooling of components on or adjacent the circuit board portion 200, and/or a variety of other board elements that one of skill in the art in possession of the present disclosure would recognize would prevent the routing of traces through that portion of the circuit board portion 200.

Figure 8:
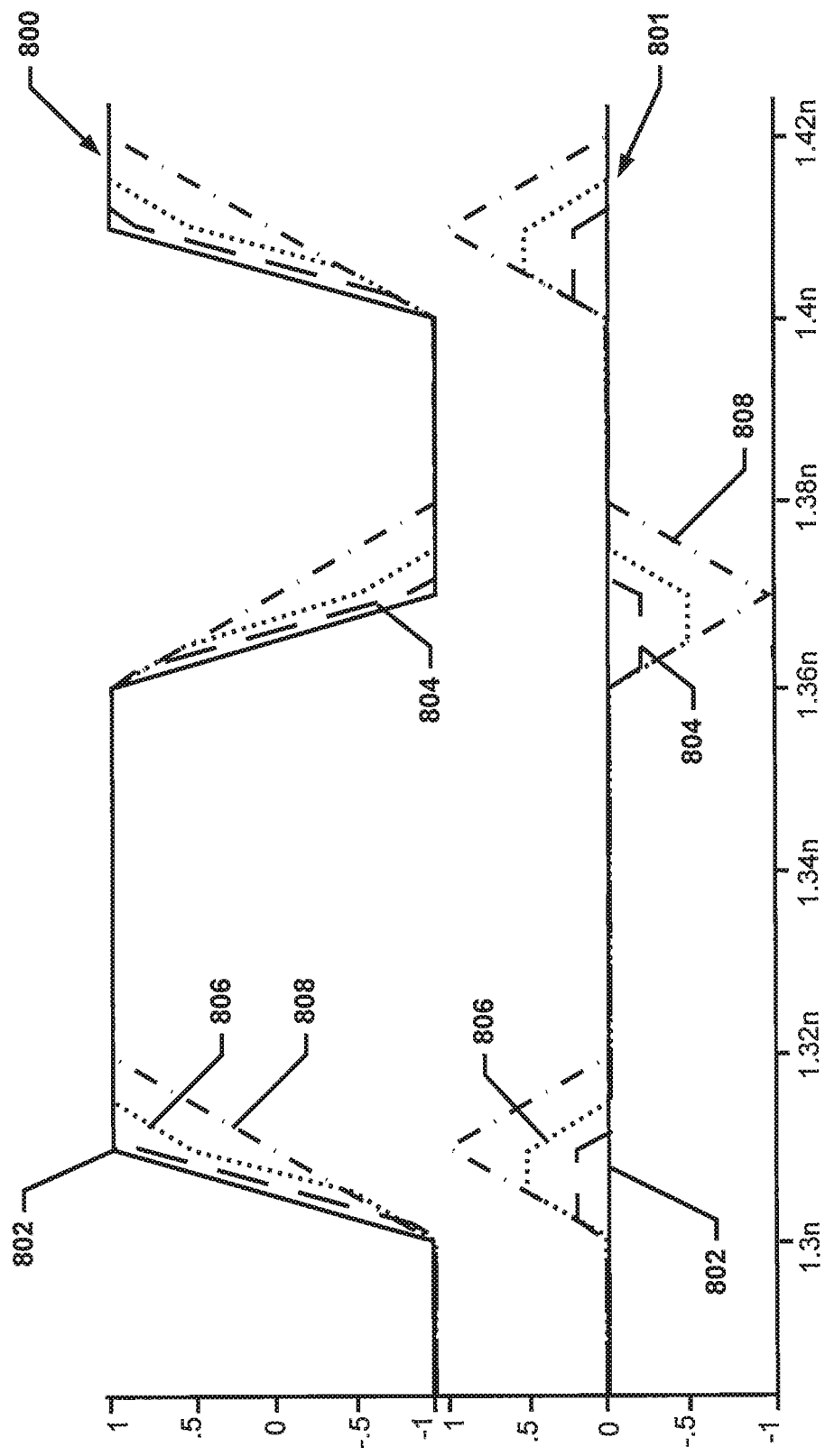
FIG. 8 is a chart illustrating an embodiment of the impact of phase mismatches on a differential signal and common mode in conventional differential trace pair systems.

As illustrated in FIG. 2A, the distance between the pads 222 and 224 is greater than the distance between the pads 212 and 214. Thus, if the differential trace pair 215 were to substantially maintain the spacing 218a between the inner edge of the trace 210 and the inner edge of the trace 220 (i.e., the edges of each traces that faces the other trace), the trace 220 would be longer than the trace 210, resulting in the common mode noise discussed above that may occur due to a phase mismatch. For example, in such conventional differential trace pairs, high speed differential signals transmitted on the traces 210 and 220 should be provided exactly 180 degrees out of phase with each other in order to ensure that the common mode signal is 0, and when those high speed differential signals deviate from 180 degrees out of phase, common mode to differential mode conversion effects will occur. As a result, the receiver may be unable to differentiate between the true differential signal and mode converted signal. This may result in the receiver detecting spurious data, which may result in errors. With reference to FIG. 8, an experimental embodiment is illustrated of phase mismatches of 0 picoseconds (ps) 802, 2 ps 804, 5 ps 806, and 10 ps 808, and one of skill in the art in possession of the present disclosure will recognize how increasing phase mismatches may have an exponential impact on the results of differential signaling 800 and a common mode 801 for a differential trace pair.

As such, as discussed above, conventional differential trace pairs may be provided with serpentine region(s) 226 that are configured to address such trace length mismatches. As can be seen in FIG. 2A, the serpentine region 226 may provide sections of the "shorter" trace 210 (i.e., the differential trace in the differential trace pair that would be shorter than the other differential trace without the serpentine region(s)) that transition away from the "longer" trace 220 (i.e., the differential trace in the differential trace pair that would be longer than the other differential trace without the serpentine region(s)) such that the trace 210 and trace 220 define a spacing 218b illustrated in FIG. 2A that is the furthest spacing between the inner edge of the trace 220 and the inner edge of the trace 210. The serpentine region(s) 226 may maintain spacing 218b for some distance before the trace 210 transitions back toward the trace 220, as illustrated. Each transition between the spacing 218a and the spacing 218b adds length to the "shorter" trace 210, and the differential trace pair 215 may include a plurality of the serpentine regions 226 such that the trace 210 is provided with substantially the same length as the trace 220. While a specific differential trace pair has been illustrated and described, one of skill in the art in possession of the present disclosure will recognize that differential trace pairs may include a variety of different features (e.g., turns, different transitions, etc.) while remaining within the scope of the present disclosure.

One of skill in the art in possession of the present disclosure will recognize that the differential trace pair 215 will produce an impedance that may depend, at least in part, on the width of the differential traces (e.g., the trace 210 and the trace 220) in the differential trace pair 215, the spacing (e.g., the differential trace pair spacing 218a and 218b) between the differential traces, the data transmission speed of signals transmitted through the differential trace pair 215, as well as a variety of other factors (e.g., the dielectric constant of the differential traces, the loss dielectric materials of the differential traces, etc.). Furthermore, in dense circuit board configurations such as those as illustrated in FIG. 2A, the serpentine regions 226 may cause spacing between the trace 210 and the trace 230 to decrease from spacing 228a to spacing 228b. One of skill in the art in possession of the present disclosure will recognize that the reduced spacing between the trace 210 and the trace 230 may introduce or increase crosstalk between the traces 210 and 230. One solution to address such crosstalk is to move the trace 230 further away from the trace 210 to minimize crosstalk coupling. However, in densely packed printed circuit boards, moving the trace 230 further away may not be possible unless the area of the printed circuit board portion 200 is expanded. Furthermore, as discussed above, the impedance mismatch between the traces 210 and 220 at signal speeds above 25 Gbps may result in reflections, return losses, insertion losses, and/or a variety of other issues that result in degradation of the Bit Error Rate (BER) and Eye Diagram, and that reduce the margin for detecting errors in data transmission and reception.

Figure 3A:
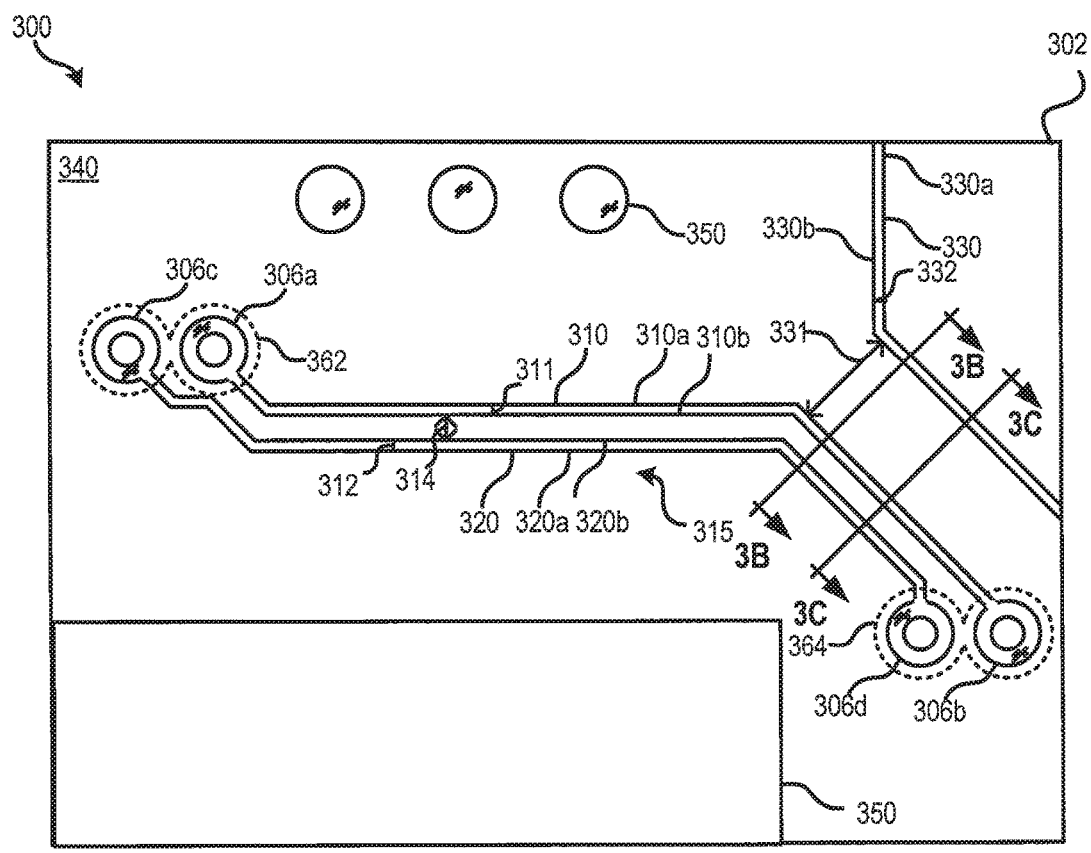
FIG. 3A is a schematic, plan view illustrating an embodiment of a differential trace pair system of the present disclosure.
Figure 3B:
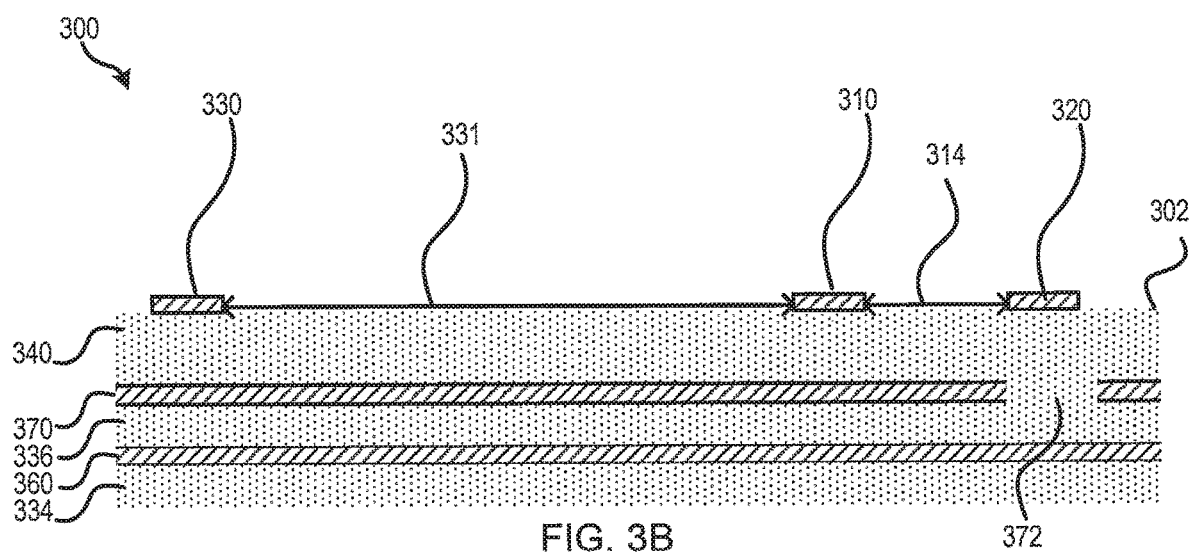
FIG. 3B is a cross-sectional view of an embodiment of the differential trace pair system of FIG. 3A along plane 3B.
Figure 3C:
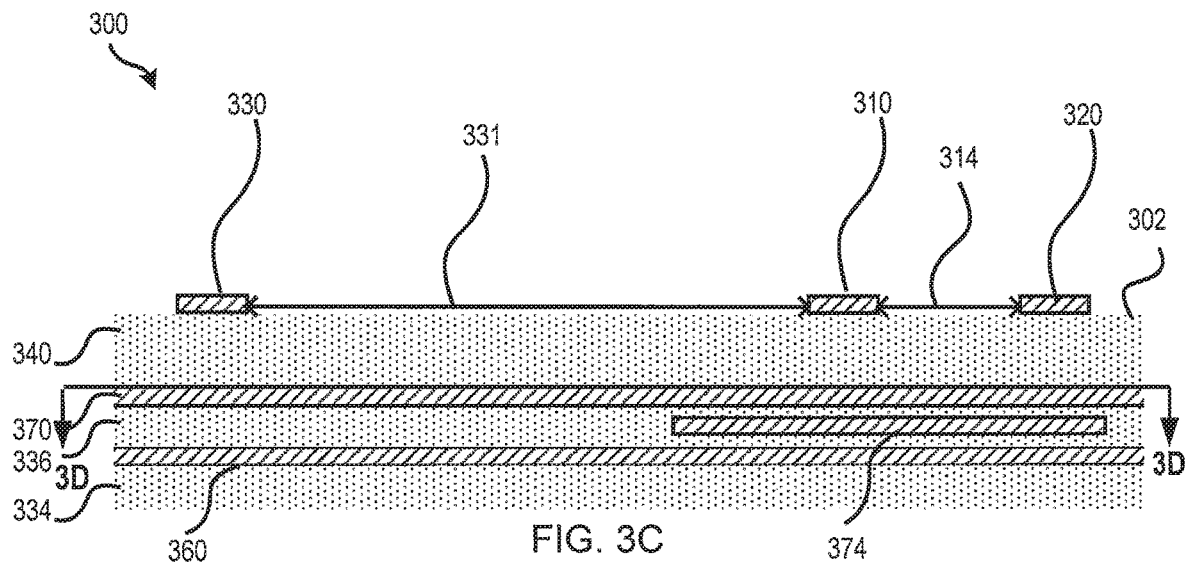
FIG. 3C is a cross-sectional view of an embodiment of the differential trace pair system of FIG. 3A along plane 3C.
Figure 3D:
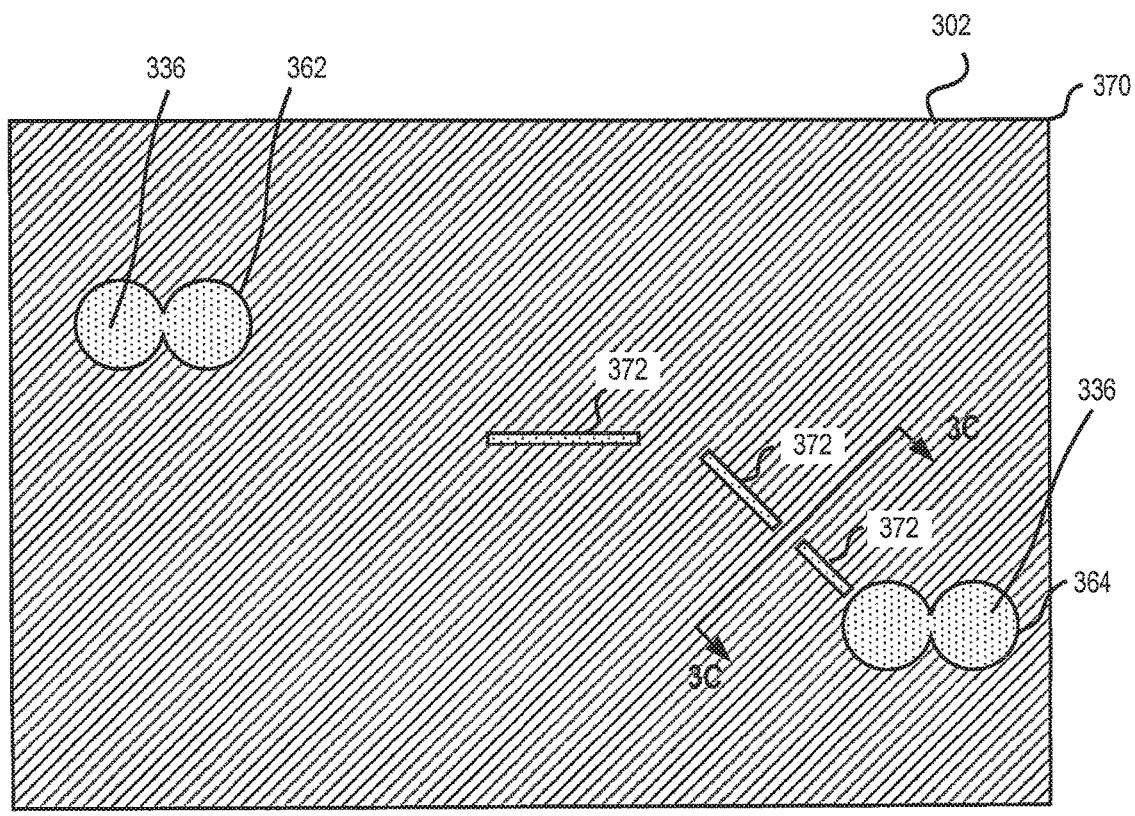
FIG. 3D is a plan view of an embodiment of a conductive layer of the differential trace pair system of FIGS. 3A-3C along the plane 3D.
Figure 4A:
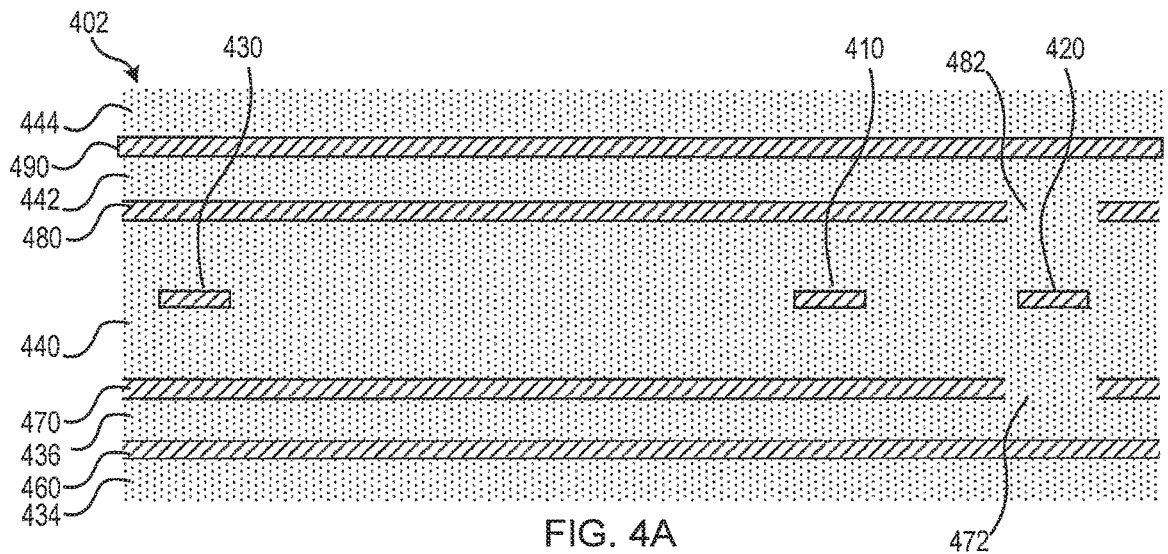
FIG. 4A is a cross-sectional view of an embodiment of a circuit board within which a differential trace pair of the differential trace pair system of FIGS. 3A-3D is provided.
Figure 4B:
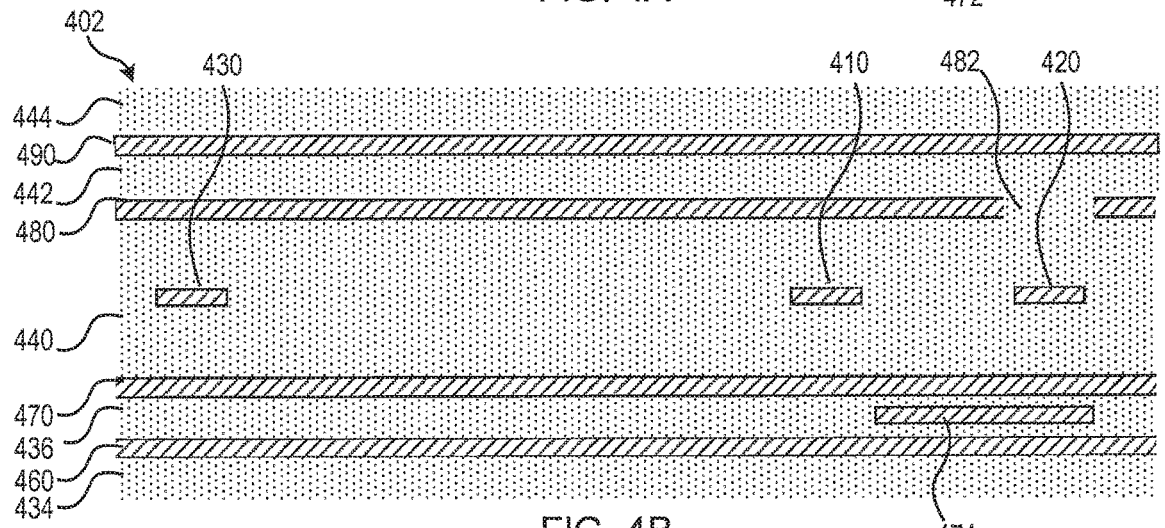
FIG. 4B is a cross-sectional view of an embodiment of a circuit board within which a differential trace pair of the differential trace pair system of FIGS. 3A-3D is provided.
Figure 4C:
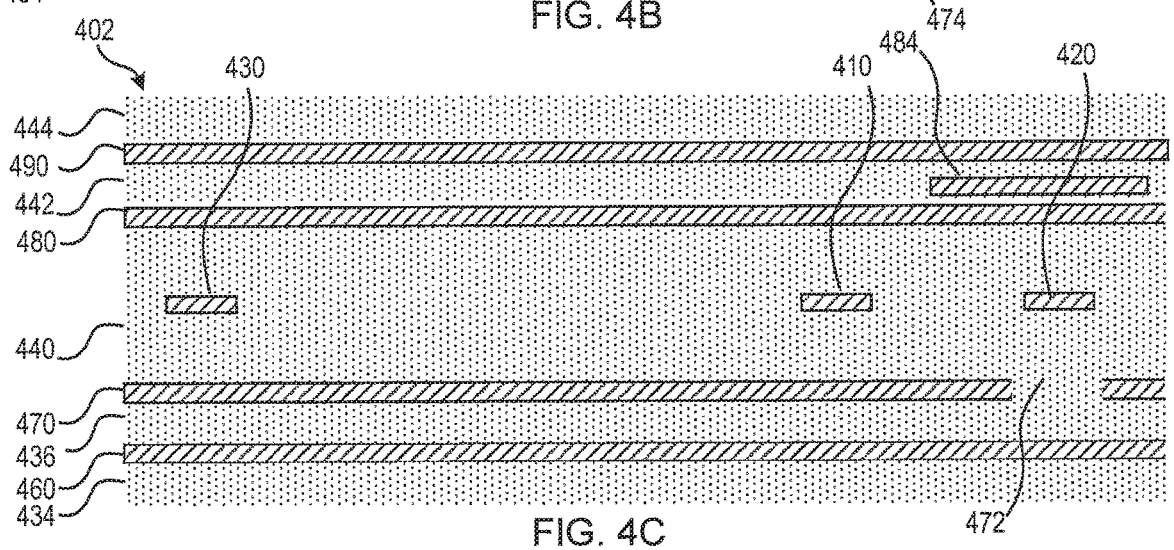
FIG. 4C is a cross-sectional view of an embodiment of a circuit board within which a differential trace pair of the differential trace pair system of FIGS. 3A-3D is provided.

Referring now to FIGS. 3A, 3B, 3C, and 3D, an embodiment of a differential trace pair system 300 according to the teachings of the present disclosure is illustrated. The differential trace pair system 300 may be provided, for example, in the IHS 100 discussed above with reference to FIG. 1, and/or in a component of the IHS 100. The differential trace pair system 300 includes a circuit board 302 (a portion of which is illustrated in FIGS. 3A and 3B) that may be provided by a motherboard, a card, and/or a variety of other board or differential-trace-pair-supporting structures that would be apparent to one of skill in the art in possession of the present disclosure. As would be understood by one of skill in the art, the plan view of the circuit board 302 in FIG. 3A may be either top/bottom view (e.g., a view looking at a top surface or bottom surface of the circuit board 302), or a cross-sectional view (e.g., a view looking at a layer of the circuit board 302 that is located between a top surface and bottom surface of the circuit board 302, embodiments of which are illustrated in FIGS. 4A-4C discussed below). As such, the teachings of the present disclosure may be applied to microstrip structures (e.g., differential trace pairs routed on a top or bottom surface of a circuit board 302), stripline structures (e.g., differential trace pairs routed in inner layers of a printed circuit board), and/or other differential trace pair structures that would be apparent to one of skill in the art in possession of the present disclosure. Thus, one of skill in the art in possession of the present disclosure would understand that other layers above and below these layers illustrated in FIGS. 3A-3D may exist in the circuit board 302.

In the illustrated embodiment, the circuit board 302 includes a board structure 350 that may be, for example, a mounting structure for a processing system (e.g., a processing system that includes the processor 102 discussed above with reference to FIG. 1) and/or a memory system (e.g., a memory system that includes the memory 114 discussed above with reference to FIG. 1), an airflow opening that is configured to ensure cooling of components on or adjacent the circuit board 302, and/or a variety of other board elements that one of skill in the art in possession of the present disclosure would recognize would prevent the routing of traces through that portion of the circuit board 302. The circuit board 302 may include a plurality of board structure members 306 such as, for example, a board structure member 306a, a board structure member 306b, a board structure member 306c, and a board structure member 306d that are coupled together by a differential trace pair 315 that is provided in the circuit board 302 in the examples discussed below. For example, the board structure member 306a and the board structure member 306c may be couplings/connectors for a transmitter subsystem, while the board structure member 306b and the board structure member 306d may be couplings/connectors for a receiver subsystem. The board structure members 306a-306d may be board connection elements that may include connection pads (e.g., similar to the pads 212, 214, 222, and 224 of FIG. 2A), vias, and/or other board connections elements that would be apparent to one of skill in the art in possession of the present disclosure. While not illustrated as connected to other components, in a specific example, the board structure members 306a-306d may include connections to each of a processing system mounting structure (e.g., provided as the board structure 350) and a memory system mounting structure (not illustrated), although other connection configurations will fall within the scope of the present disclosure as well.

The plan view of FIG. 3A also illustrates a trace 310 and a trace 320 of the differential trace pair 315, a trace 330, and an insulating layer 340, and one of skill in the art in possession of the present disclosure will recognize that a conductive layer 370 included in the circuit board 302 is coextensive with the insulating layer 340 except for the clearances 362 and 364, indicated by hidden lines, in which the conductive layer 370 is removed so that it does not short to plated through-holes co-located with board structure members 306a-306d.

The differential trace pair 315 includes the trace 310 that extends between (e.g., electrically couples) the board structure member 306a and the board structure member 306b, and the differential trace pair 315 also includes the trace 320 that extends between the board structure member 306c and the board structure member 306d. The trace 310 includes an outer edge 310a of the differential trace pair 315 and includes an inner edge 310b that is located opposite the trace 310 from the outer edge 310a. The outer edge 310a and the inner edge 310b define a trace width 311. The trace 320 includes an outer edge 320a of the differential trace pair 315 and includes an inner edge 320b that is located opposite the trace 320 from the outer edge 320a and that faces the inner edge 310b of the trace 310. The outer edge 320a and the inner edge 320b define a trace width 312. The trace 310 and the trace 320 in the differential trace pair 315 define a spacing 314 between the inner edge 310b and the inner edge 320b. Furthermore, the trace 330 includes a first edge 330a and includes a second edge 330b that is located opposite the trace 330 from the first edge 330a. The first edge 330a and the second edge 330b define a trace width 332. The trace 310 and the trace 330 may define a spacing 331 between the outer edge 310a and the second edge 330b.

In the illustrated embodiment, the differential trace pair 315 and the trace 330 are illustrated in a "congested routing configuration," which may exist when the differential trace pair 315 and the trace 330 are routed adjacent between the board structures 350 as a result of the area available on the circuit board 302 not being sufficient to space apart the differential trace pair 315 and the trace 330 from each other by some desired or minimum distance. In the specific examples illustrated and described below, the routing of the differential trace pair 315 and the trace 330 is considered congested based on the spacing 331 between the differential trace pair 315 and the trace 330 being less than two times the dielectric thickness (e.g., the distance between the different trace pair and a reference plane (e.g., a ground plane) in the circuit board 302), although other differential trace pair spacing distances may provide congested routing configurations while remaining within the scope of the present disclosure. While specific examples are provided herein, one of skill in the art in possession of the present disclosure will recognize that congestion routing may exist with a variety of different differential trace pair spacings and configurations, which may result in the increased amounts of crosstalk discussed above in the event the teachings of the present disclosure are not utilized.

While a "congested routing configuration" is discussed below, the differential trace pair 315 and the trace 330 may be provided on the circuit board 320 in a "non-congested routing configuration" in which the differential trace pair 315 and the trace 330 may be routed on the circuit board 302 when there is sufficient area available on the circuit board 302 to space the differential trace pair 315 and the trace 330 apart from each other by the desired or minimum distance. For example, the routing of the differential trace pair 315 and the trace 330 may be considered non-congested when the spacing 331 between the differential trace pair 315 and the trace 330 is at least five times the dielectric thickness (e.g., the distance between the different trace pair and a reference plane (e.g., a ground plane) in the circuit board 302), although other differential trace pair spacing distances may provide non-congested routing configurations while remaining within the scope of the present disclosure. In various embodiments in which the trace 310 is "shorter" than the trace 320 and serpentine regions 226 of FIG. 2A are added to the trace 310, an otherwise non-congested routing configuration may result in a congested routing configuration due to the decreased spacing 331 due to the added serpentine regions 226.

As illustrated in FIG. 3A, the distance between the board structure member 306a and the board structure member 306b is less than the distance between the board structure member 306c and the board structure member 306d. Thus, if the differential trace pair 315 were to substantially maintain the spacing 314 between the inner edge 310b of the trace 310 and the inner edge 420b of the trace 320, the trace 320 would be longer than the trace 410, resulting in the common mode noise discussed above. As such, as discussed above, conventional differential trace pairs may include serpentine region(s) to address such trace length mismatches. However, as discussed above, these serpentine region(s) may lead to impedance mismatches, which at signal speeds above 25

Gbps may result in reflections, return losses, insertion losses, and/or a variety of other issues that result in degradation of the Bit Error Rate (BER) and Eye Diagram, and that reduce the margin for detecting errors in data transmission and reception. Also, in congested routing configurations, crosstalk coupling may occur between the differential trace pair 315 and an adjacent trace (e.g., the trace 330) that is not included in the differential trace pair 315.

Thus, embodiments of the present disclosure are configured to maintain the spacing 314 between the traces 310 and 320 along the differential trace pair 315, and/or provide fewer serpentine regions than would otherwise be needed for differential trace pairs that do not incorporate the teachings of the present disclosure, such that a predetermined crosstalk coupling threshold is maintained while maintaining a predetermined phase mismatch threshold. In various embodiments, a conductive layer 370 defines one or more apertures 372 extending through the conductive layer 370, as illustrated in the cross-sectional view of the circuit board 302 along plane 3B of FIG. 3B, as well as the cross-sectional view of the conductive layer 370 in FIG. 3D. The aperture 372 may be contiguous, or may be non-contiguous such that there a plurality of apertures 372 provided through the conductive layer 370. The aperture 372 may be configured to provide for the engagement of the insulating layer 336 and the insulating layer 340, as illustrated in FIG. 3B. The aperture 372 may be defined in the conductive layer 370 adjacent to the trace 320 (i.e., the "longer" trace of the differential trace pair 315.) The aperture 372 may be adjacent to the trace 320 by being positioned orthogonally below and/or above the trace 320. As would be understood by one of skill in the art in possession of the present disclosure, the aperture 372 causes the portion of the trace 320 adjacent to the aperture 372 to be referenced to the conductive layer 360, and referencing a portion of the trace 320 to the conductive layer 360 increases the impedance on that portion of the trace 320 due to the increase in distance, which results in an increased propagation speed for the differential signal on that portion of the "longer" trace 320. The increase in the impedance is due to the reduced capacitive coupling, which when reduced, the propagation delay is reduced and thus increases the signal transmission. This increase in the speed of the signal in the longer trace 320 may be configured to cancel out the effect of the longer length of the trace 320 by allowing that signal to "catch up" to the signal transmitted in the shorter trace 310. For example, the area of the aperture 372 may be configured such that the phase skew on the differential signaling and the common mode are reduced to zero (e.g., the signals transmitted on the traces 310 and 320 are 180 degrees out of phase), or such that a predetermined threshold of phase mismatch that is acceptable for the given circuit board 302 is generated.

As discussed above, FIG. 3B illustrates a cross-sectional view of the circuit board 302 along plane 3B. As can be seen, the circuit board 302 may include an insulating layer 334. A conductive layer 360 may be located immediately adjacent the insulating layer 334 and immediately adjacent an insulating layer 336, which is opposite the conductive layer 360 from the insulating layer 334. The circuit board 302 may also include the second conductive layer 370 located immediately adjacent the insulating layer 336 and opposite the insulating layer 336 from the conductive layer 360. As discussed above, the conductive layer 370 includes the aperture 372 that extends through the conductive layer 370. In various embodiments, an insulating layer 340 is located immediately adjacent the conductive layer 370 and opposite the conductive layer 370 from the insulating layer 336. The aperture 372 provides for the engagement of the insulating layer 340 and the insulating layer 336. The differential trace pair 315 is included in the insulating layer 340 (e.g., when the insulating layer 340 is not the top layer or bottom layer of the circuit board 302), or on the insulating layer (e.g., when the insulating layer 340 is the top layer or bottom layer of the circuit board 302) such that the differential trace pair 315 is spaced apart from the conductive layer 370. In such a configuration, the trace 310 is positioned adjacent the conductive layer 370 and configured to reference to the conductive layer 370, while the trace 320 that is longer than the trace 310 includes a first portion that is positioned adjacent the aperture 372 and configured to reference the conductive layer 360, while the remaining portion of the trace 320 is positioned adjacent the conductive layer 370 and configured to reference the conductive layer 370.

In various embodiments, the insulating layers 334, 336, and/or 340 may include a silicon oxide film, which may be formed by plasma-enhanced chemical vapor deposition (PE-CVD). However, one of skill in the art in possession of the present disclosure will recognize that a wide variety of insulating materials and processes for layering materials may be used for one or more of the insulating layers 334, 336, and/or 340 described herein. For example, each insulating layer 334, 336, and/or 340 may include one or more of an organic SOG (spin-on-glass) film, HSQ (hydro-silsesquioxane), polyarylether, fluorinated polyarylether, inorganic polysilazane, organic polysilazane, BCB (benzocyclobutene), MSQ (methyl-silses-quioxane), fluorinated polyimide, plasma CF polymer, plasma CH polymer, Teflon AF®, Parylene N® (polyparaxylylene N), Parylene AF4® (polyparaxylylene F), polynapthalene N, silicon nitride (SiN) and/or silcon oxynitride (SiON), as well as any other insulating materials that would be apparent to one of skill in the art in possession of the present disclosure.

In various embodiments, the conductive layers 360 and 370 may include copper (Cu) or copper alloy material. However, materials such as tungsten (W), gold (Au), TiN, and/or any conductive material that would be apparent to one of skill in the art in possession of the present disclosure may be used as well. The conductive layers 360 and 370 may be coupled to a reference potential, e.g., grounded to act as a ground layer.

As discussed above, the aperture 372 may be non-contiguous such that more than one aperture 372 is provided in the conductive layer 370. In various embodiments and with reference to cross-sectional view of the circuit board 302 along plane 3C in FIG. 3C, a conductive structure 374 may be provided in the insulating layer 336. For example, the conductive structure 374 may be another single trace, or a trace of differential trace pair, that crosses below the trace 320. As such, if the aperture 372 is located adjacent the trace 320 and the conductive structure 374 when that conductive structure 374 is not a ground layer (or includes a reference potential that is not desired), the trace 320 may reference the conductive layer 370 to prevent crosstalk between the conductive structure 374 and the trace 320, as well as provide other benefits that would be apparent to one of skill in the art in possession of the present disclosure.

Referring to FIGS. 4A, 4B, and 4C, various embodiments of the differential trace pair system 400 are illustrated that provide examples of the differential trace pair 315 of FIGS. 3A-3D located within a layer of the circuit board 302 between a top surface and a bottom surface of the circuit board 302. Referring to FIG. 4A, a first cross sectional view of a circuit board 402 is illustrated that may be provided, for example, by the circuit board 302 discussed above with reference to FIG. 3. The circuit board 402 may include an insulating layer 434. A conductive layer 460 may be located immediately adjacent the insulating layer 434 and immediately adjacent an insulating layer 436, which is opposite the conductive layer 460 from the insulating layer 434. The circuit board 402 may also include a conductive layer 470 located immediately adjacent the insulating layer 436 and opposite the insulating layer 436 from the conductive layer 460. The conductive layer 470 may include an aperture 472 that extends through the conductive layer 470. In various embodiments, an insulating layer 440 is located immediately adjacent the conductive layer 470 and opposite the conductive layer 470 from the insulating layer 436. The aperture 472 provides for the engagement of the insulating layer 440 and the insulating layer 436. A differential trace pair 410/420 is included in the insulating layer 440 such that the differential trace pair 410/420 is spaced apart from the conductive layer 470. In such a configuration, a trace 410 included in the differential trace pair 410/420 is positioned adjacent the conductive layer 470 and configured to reference to the conductive layer 470, and a trace 420 that is "longer" than the trace 410 includes a first portion that is positioned adjacent the aperture 472 and configured to reference the conductive layer 460 while the remaining portion of the trace 420 is positioned adjacent the conductive layer 470 and configured to reference the conductive layer 470. A trace 430 may also be provided in the insulating layer 440 and adjacent the trace 410.

In various embodiments, the circuit board 402 may also include a conductive layer 480 that may be located immediately adjacent the insulating layer 440 and opposite the insulating layer 440 from the conductive layer 470. The conductive layer 480 may include an aperture 482 that extends through the conductive layer 480. The circuit board 402 may also include an insulating layer 442 that may be located immediately adjacent the conductive layer 480 and opposite the conductive layer 480 from the insulating layer 440, a conductive layer 490 that may be located immediately adjacent the insulating layer 442 and opposite the insulating layer 442 from the conductive layer 480, and an insulating layer 444 that may be located immediately adjacent the conducting layer 490 and opposite the conducting layer 490 from the insulating layer 442. The aperture 482 provides for the engagement of the insulating layer 440 and the insulating layer 442. The differential trace pair 410/420 is spaced apart from the conductive layer 480. In such a configuration, the trace 410 included in the differential trace pair 410/420 is positioned adjacent the conductive layer 480 and configured to reference to the conductive layer 480, and the first portion of the trace 420 that is "longer" than the trace 410 is positioned adjacent the aperture 482 and configured to reference the conductive layer 490 while the remaining portion of the trace 420 is positioned adjacent the conductive layer 480 and configured to reference the conductive layer 480.

Referring now to FIG. 4B, a second cross-sectional view of the circuit board 402 is illustrated. As discussed above, the circuit board 402 may include an insulating layer 434. A conductive layer 460 may be located immediately adjacent the insulating layer 434 and immediately adjacent an insulating layer 436, which is opposite the conductive layer 460 from the insulating layer 434. The circuit board 402 may also include a conductive layer 470 located immediately adjacent the insulating layer 436 and opposite the insulating layer 436 from the conductive layer 460. In various embodiments, an insulating layer 440 is located immediately adjacent the conductive layer 470 and opposite the conductive layer 470 from the insulating layer 436. A differential trace pair 410/420 is included in the insulating layer 440 such that the differential trace pair 410/420 is spaced apart from the conductive layer 470. In such a configuration, a trace 410 included in the differential trace pair 410/420 is positioned adjacent the conductive layer 470 and configured to reference to the conductive layer 470, and a trace 420 that is "longer" than the trace 410 includes a portion that is positioned adjacent a conductive structure 474 that may be provided in the insulating layer 436. For example, the conductive structure 474 may be another single trace, or a trace of differential trace pair, that is crossing below the trace 420. As such, if the aperture 472 of FIG. 4A is located adjacent the trace 420 and the conductive structure 474 at the second cross section of the circuit board 402 and when that conductive structure 474 is not a ground layer (or includes a reference potential that is not desired), the trace 420 may reference the conductive layer 470 to prevent crosstalk between the conductive structure 474 and the trace 420, as well as provide other benefits that would be apparent to one of skill in the art in possession of the present disclosure. A trace 430 may also be provided in the insulating layer 440 and adjacent the trace 410.

In various embodiments, the circuit board 402 may also include a conductive layer 480 that may be located immediately adjacent the insulating layer 440 and opposite the insulating layer 440 from the conductive layer 470. The conductive layer 480 may include an aperture 482 that extends through the conductive layer 480. The circuit board 402 may also include an insulating layer 442 that may be located immediately adjacent the conductive layer 480 and opposite the conductive layer 480 from the insulating layer 440, a conductive layer 490 that may be located immediately adjacent the insulating layer 442 and opposite the insulating layer 442 from the conductive layer 480, and an insulating layer 444 that may be located immediately adjacent the conducting layer 490 and opposite the conducting layer 490 from the insulating layer 442. The aperture 482 provides for the engagement of the insulating layer 440 and the insulating layer 442. The differential trace pair 410/420 is spaced apart from the conductive layer 480. In such a configuration, the trace 410 included in the differential trace pair 410/420 is positioned adjacent the conductive layer 480 and configured to reference to the conductive layer 480, and the first portion of the trace 420 that is "longer" than the trace 410 is positioned adjacent the aperture 482 and configured to reference the conductive layer 490 while the remaining portion of the trace 420 is positioned adjacent the conductive layer 480 and configured to reference the conductive layer 480.

Referring now to FIG. 4C, a third cross-sectional view of the circuit board 402 is illustrated. As discussed above, the circuit board 402 may include an insulating layer 434. A conductive layer 460 may be located immediately adjacent the insulating layer 434 and immediately adjacent an insulating layer 436, which is opposite the conductive layer 460 from the insulating layer 434. The circuit board 402 may also include a conductive layer 470 located immediately adjacent the insulating layer 436 and opposite the insulating layer 436 from the conductive layer 460. The conductive layer 470 may include an aperture 472 that extends through the conductive layer 470. In various embodiments, an insulating layer 440 is located immediately adjacent the conductive layer 470 and opposite the conductive layer 470 from the insulating layer 436. The aperture 472 provides for the engagement of the insulating layer 440 and the insulating layer 436. A differential trace pair 410/420 is included in the insulating layer 440 such that the differential trace pair 410/420 is spaced apart from the conductive layer 470. In such a configuration, a trace 410 included in the differential trace pair 415 is positioned adjacent the conductive layer 470 and configured to reference to the conductive layer 470, and a trace 420 that is "longer" than the trace 410 includes a first portion that is positioned adjacent the aperture 472 and configured to reference the conductive layer 460 while the remaining portion of the trace 420 is positioned adjacent the conductive layer 470 and configured to reference the conductive layer 470. A trace 430 may also be provided in the insulating layer 440 and adjacent the trace 410.

In various embodiments, the circuit board 402 may also include a conductive layer 480 that may be located immediately adjacent the insulating layer 440 and opposite the insulating layer 440 from the conductive layer 470. The circuit board 402 may also include an insulating layer 442 that may be located immediately adjacent the conductive layer 480 and opposite the conductive layer 480 from the insulating layer 440, a conductive layer 490 that may be located immediately adjacent the insulating layer 442 and opposite the insulating layer 442 from the conductive layer 480, and an insulating layer 444 that may be located immediately adjacent the conducting layer 490 and opposite the conducting layer 490 from the insulating layer 442. The aperture 482 provides for the engagement of the insulating layer 440 and the insulating layer 442. The differential trace pair 410/420 is spaced apart from the conductive layer 480. In such a configuration, the trace 410 included in the differential trace pair 410/420 is positioned adjacent the conductive layer 480 and configured to reference to the conductive layer 480, and the first portion of the trace 420 that is "longer" than the trace 410 is positioned adjacent a conductive structure 484 that may be provided in the insulating layer 442. For example, the conductive structure 484 may be another single trace, or a trace of differential trace pair, that is located below the trace 420. As such, if the aperture 482 of FIG. 4A is located adjacent the trace 420 and the conductive structure 484 at the third cross section of the circuit board 402 and when that conductive structure 484 is not a ground layer (or includes a reference potential that is not desired), the trace 420 may reference the conductive layer 480 to prevent crosstalk between the conductive structure 484 and the trace 420, as well as provide other benefits that would be apparent to one of skill in the art in possession of the present disclosure.

Figure 5:
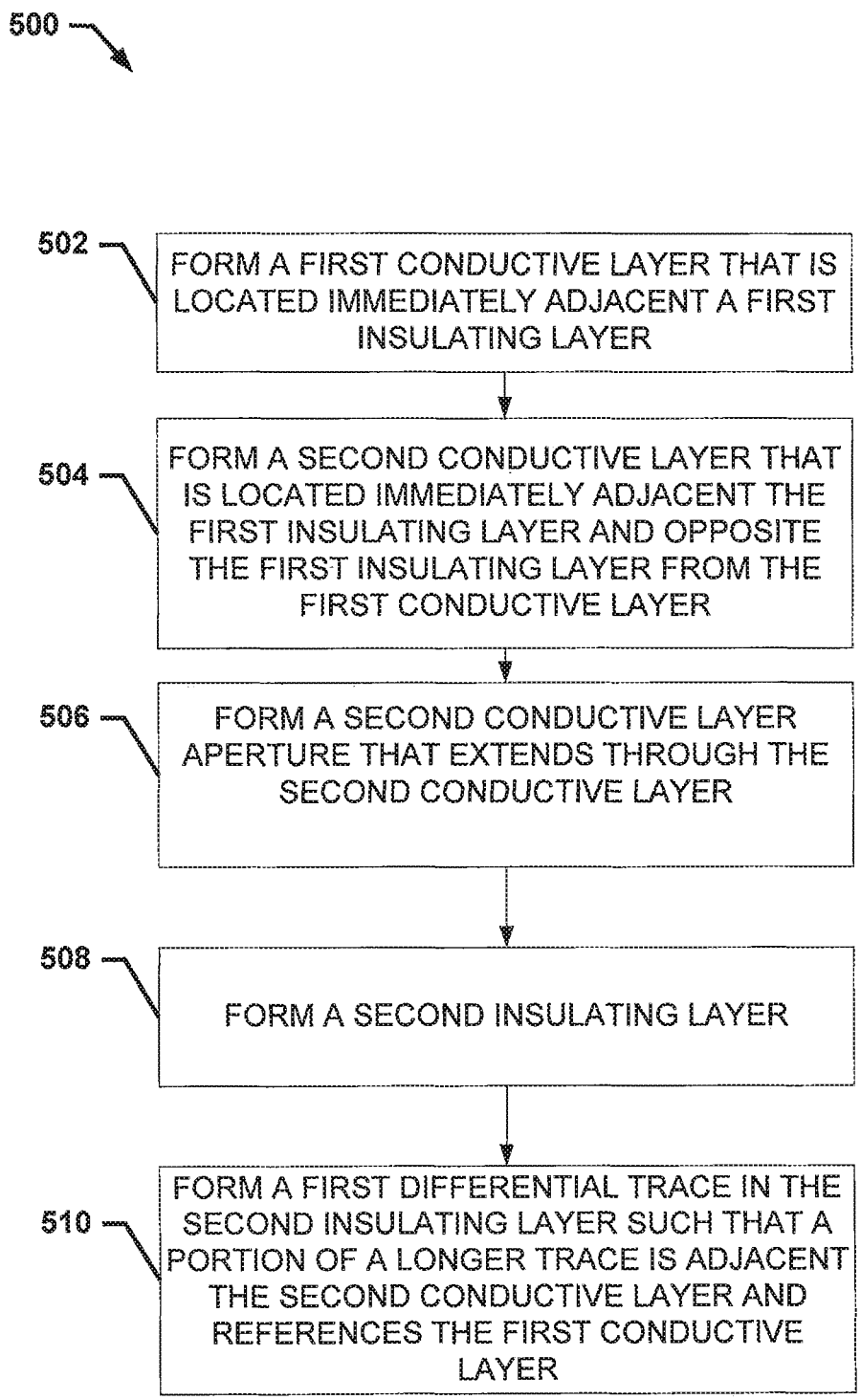
FIG. 5 is a flow chart illustrating an embodiment of a method for fabricating a differential trace pair system.

Referring now to FIG. 5, an embodiment of a method 500 of FIG. 5 for providing a differential trace pair system is illustrated. As discussed above, the systems and methods of the present disclosure provide for the high speed transmission of signals through a differential trace pair in a circuit board that is relatively closely spaced to another differential trace pair or single trace, with one of the traces of the differential trace pair being "longer" than the other trace of the differential trace pair. The signal speed on the "longer" trace of the differential trace pair is increased by providing a first conductive layer aperture, in a first conductive layer in the circuit board, that is adjacent a portion of the "longer" trace in order to cause that portion of the "longer" trace to reference a second conductive layer in the circuit board that is spaced apart from the differential trace pair at a greater distance than the first conductive layer that defines the first conductive layer aperture. Referencing the second conductive layer that is further away increases impedance at that portion of the "longer" trace, which increases the propagation speed of the signal on that "longer" trace to 'catch up' to the propagation speed of the signal of the "shorter" trace in order to reduce or eliminate phase mismatch due to the unequal lengths of the traces. As such, conventional systems and methods that provide serpentine regions on the "shorter" trace in order to increase the length of the "shorter" trace and reduce or eliminate phase mismatch are no longer needed, or can be reduced in number. As discussed above, these serpentine regions in a densely packed circuit board may result in increased crosstalk with neighboring traces or differential trace pairs. As such, the teachings of the present disclosure enable closer spacing of differential trace pairs with reduced crosstalk relative to conventional systems, allowing for denser circuit boards and/or other benefits that would be apparent to one of skill in the art in possession of the present disclosure.

The method 500 begins at block 502 where a first conductive layer is formed that is located immediately adjacent a first insulating layer. In an embodiment of block 502 and with reference to FIGS. 3A-3D, 6A, and 6B, a first conductive layer 360 is provided. In various examples, the first conductive layer 360 is formed on a base insulating layer 334. For example, the first conductive layer 360 may be formed by sputtering, thin-film deposition, and any other conductive layer fabrication technique that would be apparent to one of skill in the art in possession of the present disclosure. The first conductive layer 360 may include copper (Cu) or copper alloy material. However, materials such as tungsten (W), gold (Au), TiN, aluminum (Al), and/or any conductive material that would be apparent to one of skill in the art in possession of the present disclosure may be used as well. The conductive layers 360 may be coupled to a reference potential, e.g., grounded to act as a ground layer.

Figure 6A:
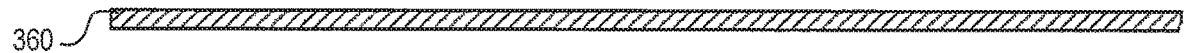
FIGS. 6A-6E are cross-sectional views illustrating an embodiment of the fabrication of the differential trace pair system of FIGS. 3A-3D according to the method of FIG. 5.
Figure 6B:
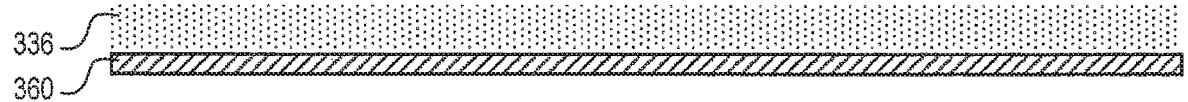

Referring to FIG. 6B, the first conductive layer 360 may be formed immediately adjacent a first insulating layer 336. The first insulating layer 336 may be formed by plasma-enhanced chemical vapor deposition (PE-CVD) and/or any other insulating layer fabrication technique that would be apparent to one of skill in the art in possession of the present disclosure. The first insulating layer 336 may include one or more of silicon oxide, organic SOG (spin-on-glass) film, HSQ (hydro-silses-quioxane), polyarylether, fluorinated polyarylether, inorganic polysilazane, organic polysilazane, BCB (benzocyclobutene), MSQ (methyl-silses-quioxane), fluorinated polyimide, plasma CF polymer, plasma CH polymer, Teflon AF®, Parylene N® (polyparaxylylene N), Parylene AF4® (polyparaxylylene F), polynapthalene N, silicon nitride (SiN) and/or silcon oxynitride (SiON), as well as any other insulating materials that would be apparent to one of skill in the art in possession of the present disclosure.

Figure 6C:
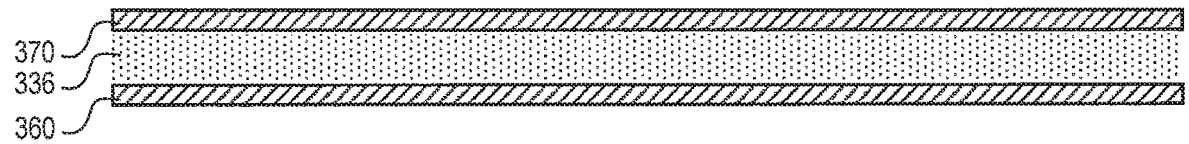

The method 500 then proceeds to block 504 where a second conductive layer is formed that is located immediately adjacent the first insulating layer and opposite the first insulating layer from the first conductive layer. In an embodiment of block 504 and referring to FIG. 6C, a second conductive layer 370 may formed (e.g., via the techniques discussed above) on the first insulating layer 336 such that the second conductive layer 370 is located immediately adjacent the first insulating layer 336 and opposite the first insulating layer 336 from the first conductive layer 360. The second conductive layer 370 may include copper (Cu) or copper alloy material. However, materials such as tungsten (W), gold (Au), TiN, aluminum (Al), and/or any conductive material that would be apparent to one of skill in the art in possession of the present disclosure may be used as well. The conductive layer 370 may be coupled to a reference potential, e.g., grounded to act as a ground layer.

Figure 6D:
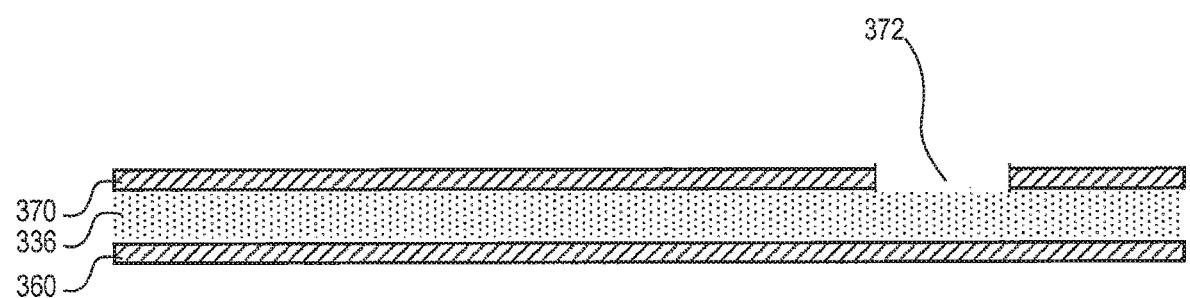

The method 500 then proceeds to block 506 where a second conductive layer aperture is formed that extends through the second conductive layer. In an embodiment of block 504 and referring to FIG. 6D, a second conductive layer aperture 372 is formed in the second conductive layer 370. The second conductive layer aperture 372 may extend through the second conductive layer 370 such that the first insulating layer 336 is exposed via the second conductive layer aperture 372. The second conductive layer aperture 372 may be defined, created, formed, etched, and/or otherwise provided by etching and masking techniques such as photoengraving, PCB milling, silk-screen printing, and/or other aperture formation techniques that would be apparent to one of skill in the art in possession of the present disclosure.

Figure 6E:
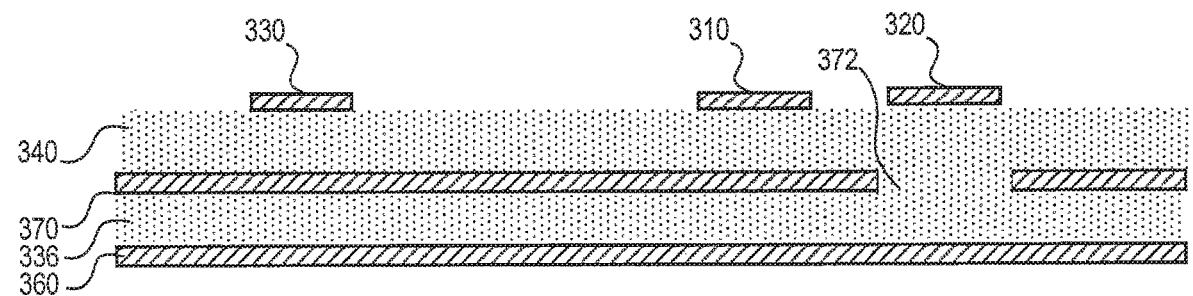

The method 500 then proceeds to block 508 where a second insulating layer is formed that is located immediately adjacent the second conductive layer and opposite the second conductive layer from the first insulating layer. In an embodiment of block 508 and with reference to FIG. 6E, a second insulating layer 340 may be formed immediately adjacent the second conductive layer 370. For example, the second insulating layer 340 may be formed by plasma-enhanced chemical vapor deposition (PE-CVD) and/or any other insulating layer fabrication technique that would be apparent to one of skill in the art in possession of the present disclosure, and may include one or more of the insulating material used for the first insulating layer 336, discussed above. In an embodiment, the second insulating layer 340 may extend through the second conductive layer aperture 372 and into engagement with the first insulating layer 336.

The method 500 then proceeds to block 510 where a first differential trace pair is formed in the second insulating layer such that the first differential trace pair is spaced apart from the second conductive layer. In an embodiment of block 510 and with reference to FIGS. 3A and 6E, a differential trace pair 315 is formed in the second insulating layer 340. For example, a trace 310 of the differential trace pair 315 may be defined, created, formed, etched, and/or otherwise provided by etching and masking techniques such as photoengraving, PCB milling, silk-screen printing, and/or other trace formation techniques that would be apparent to one of skill in the art in possession of the present disclosure. As discussed above, the trace 310 may electrically couple the board structure member 306a to the board structure member 306b, and includes at least a portion that is defined between the outer edge 310a and the inner edge 310b that define the trace width 311 of the trace 310. In an embodiment, the trace 310 is positioned adjacent the second conductive layer and configured to reference to the second conductive layer 370.

Furthermore, a trace 320 of the differential trace pair 315 may be defined, created, formed, etched, and/or otherwise provided by etching and masking techniques such as photoengraving, PCB milling, silk-screen printing, and/or other trace formation techniques that would be apparent to one of skill in the art in possession of the present disclosure. As discussed above, the trace 320 may electrically couple the board structure member 306c to the board structure member 306d, and includes at least a portion that is defined between the outer edge 320a and the inner edge 320b that define the trace width 312 of the trace 320. In an embodiment, the trace 320 is longer than the trace 310, and thus includes a first portion that is positioned adjacent the second conductive layer aperture 372 such that the first portion of the trace 320 adjacent to the second conductive layer aperture 372 is configured to reference to the first conductive layer 360, while the remaining portion of the trace 320 references the first conductive layer 370.

In an embodiment, a trace 330 may be formed adjacent the trace 310 and in the second insulating layer 340. The trace 330 may be defined, created, formed, etched, and/or otherwise provided by etching and masking techniques such as photoengraving, PCB milling, silk-screen printing, and/or other trace formation techniques that would be apparent to one of skill in the art in possession of the present disclosure. The trace 330 may electrically couple two board structure members and be configured to provide a signal between those board structure members. The trace 330 may be positioned adjacent to the trace 310 at a spacing 331. The spacing 331 may configured such that the crosstalk between the trace 330 and the trace 310 is at a predetermined threshold. For example, if trace 330 is three times the dielectric thickness, then the crosstalk may be acceptable. In other words, if the crosstalk coupling is less than 1%, then the crosstalk may be acceptable. While embodiments of the present disclosure describe the "short" trace 310 as not including any serpentine regions such as the serpentine regions 226 of FIG. 2A, one skill in the art in possession of the present disclosure will recognize that the trace 310 may include one or more serpentine regions 226 in combination with the referencing of the portion of the trace 320 to the first conductive layer 360. The referencing of the portion of the trace to the first conductive layer 360 may result in a requirement of fewer serpentine regions than would be required in conventional differential pairs connecting the same board structure members to obtain a predetermined phase match threshold, and the use of fewer serpentine regions will reduce the amount of crosstalk that is present than conventional differential pairs having more serpentine regions to obtain the same predetermine phase match threshold.

With reference to the circuit board 402 of FIG. 4A-4C, one of skill in the art in possession of the present disclosure will recognize that the additional insulator layer 440, the conductive layers 480 and 490, the aperture 482, and the insulators layers 442 and 444 may be fabricated using materials and techniques similar to those described when fabricating the circuit board 302 during method 500. As such, the particular fabrication steps utilized to produce those layers are not repeated in detail.

Figure 7:
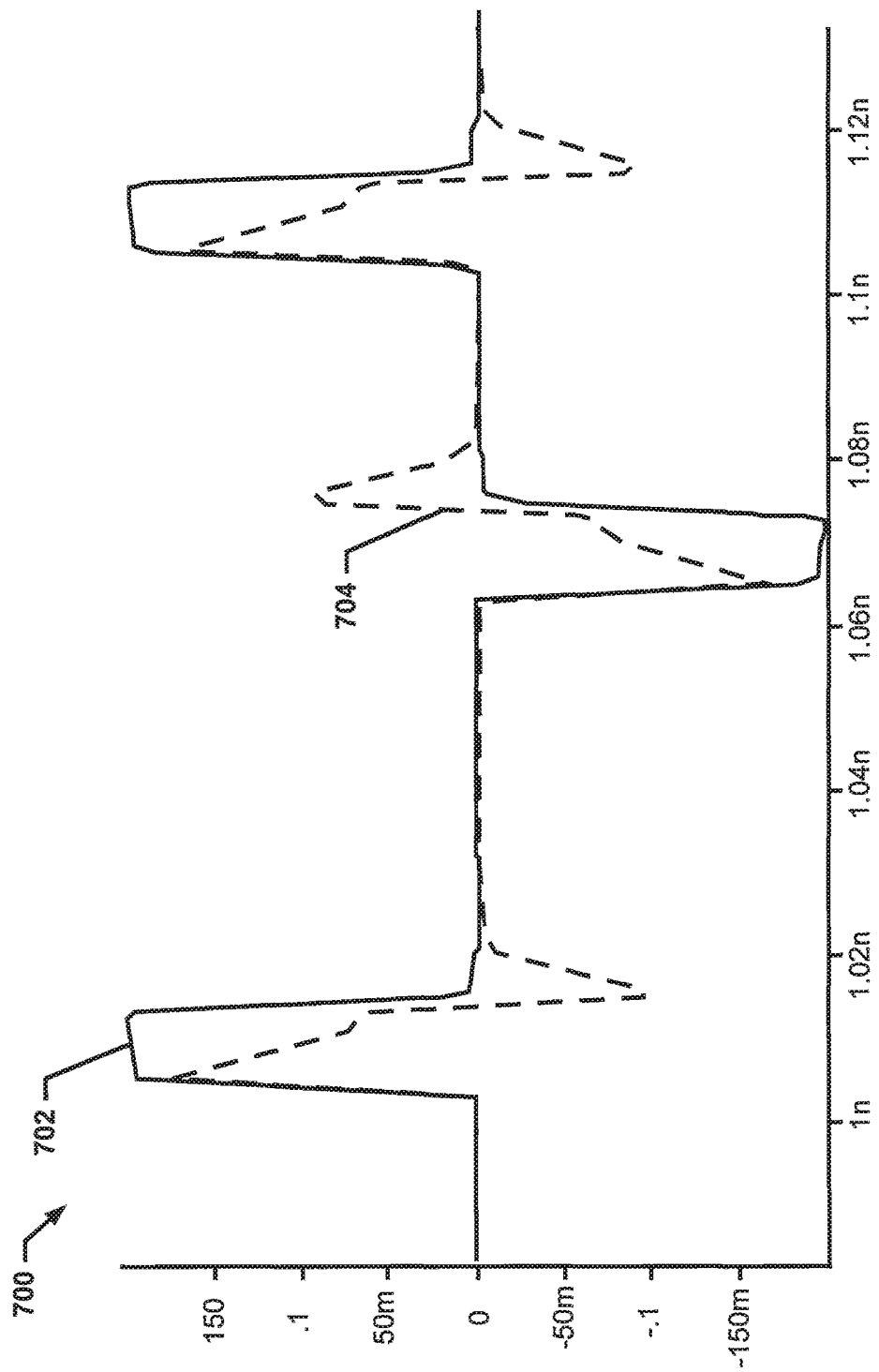
FIG. 7 is a chart illustrating an embodiment of the impact of a phase mismatch on a common mode signal transmitted via conventional differential trace pair systems and a differential trace pair system according to the teachings of the present disclosure.

Referring now to FIG. 7, a graph 700 is provided that illustrates some of the benefits of the systems and methods of the present disclosure. The graph 700 plots impact of a 2 ps phase skew on a common mode between a transmitter and a receiver using: 1) a differential trace pair with serpentine regions that provide for connection to the transmitter and the receiver as discussed above with reference to FIGS. 2A and 2B, and 2) the differential trace pair 315 of circuit board 302 illustrated in FIGS. 3A-3D. The impact of a 2 ps phase skew on a common mode of the differential trace pair 215 that includes the conventional serpentine region embodiment (as illustrated in FIGS. 2A-2B) is plotted on the graph 700 as plot 702, while the impact of a 2 ps phase skew on a common mode of the differential trace pair 315 that includes the second conductive layer aperture 372 of the present disclosure is plotted on the graph 700 as plot 704. The Y-axis is the common mode voltage and X-axis is time. As can be seen that the duration of the common mode and the amplitude of the common mode are both reduced using the systems and methods of the present disclosure. If the number of voids can be increased then even further improvement can be achieved than highlighted in FIG. 7.

Thus, systems and methods have been described that provide a differential trace pair on a circuit board that includes one of its traces longer than the other such that, without any modifications, the longer trace results in a phase mismatch when a differential signal is provided on the differential trace pair. The systems and methods of the present disclosure provide an aperture in a first conductive layer that is adjacent to at least a portion of the "longer" trace such that the portion of the "longer trace" references a second conductive layer that is spaced apart from the "longer" trace further than the spacing between the first conductive layer defining the aperture and the "longer" trace. The "shorter" trace continues to reference the conductive layer that defines the aperture. As such, impedance on the portion of the "longer" trace adjacent to the aperture is increased, which increases the propagation speed on "longer" trace. The aperture may be configured to eliminate or reduce any phase mismatching effects due to the difference in trace length of the longer and shorter traces. As such, conventional systems and methods that provide serpentine regions on the "shorter" trace to increase the length of the "shorter" trace and reduce or eliminate phase mismatch are no longer needed, or can be reduced in number. As discussed above, these serpentine regions in a densely packed circuit board may result in increased crosstalk with neighboring traces or differential trace pairs. The teachings of the present disclosure enable closer spacing of differential trace pairs with reduced crosstalk relative to conventional systems, allowing for denser circuit boards and/or other benefits that would be apparent to one of skill in the art in possession of the present disclosure.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A differential trace pair system, comprising:
    a first conductive layer that is included in a board;
    a second conductive layer that is included in the board and spaced apart from the first conductive layer, wherein the second conductive layer defines a second conductive layer opening that extends through the second conductive layer; and
    a differential trace pair that is included in the board and spaced apart from the second conductive layer opposite the second conductive layer from the first conductive layer, wherein the differential trace pair includes:
        a first differential trace that is configured to reference to the second conductive layer; and
        a second differential trace that includes a first portion that is configured to reference to the first conductive layer through the second conductive layer opening, wherein the referencing to the first conductive layer increases a propagation speed of a first signal transmitted through the first portion of the second differential trace relative to the propagation speed of the first signal transmitted through a second portion of the second differential trace that is configured to reference to the second conductive layer.

2. The differential trace pair system of claim 1, wherein the increase of the propagation speed of the first signal through the first portion of the second differential trace is configured to provide a predetermined phase mismatch with a second signal that is transmitted through the first differential trace.

3. The differential trace pair system of claim 1, wherein the first differential trace includes a serpentine region having:
    a first serpentine region portion in which the first differential trace and the second differential trace are substantially parallel and spaced part by a first differential trace pair spacing;
    a second serpentine region portion that is coupled to the first serpentine region portion and in which the first differential trace and the second differential trace are substantially parallel and spaced part by a second differential trace pair spacing that is greater than the first differential trace pair spacing; and
    a third serpentine region portion that is coupled to the second serpentine region portion and in which the first differential trace and the second differential trace are substantially parallel and spaced part by the first differential trace pair spacing.

4. The differential trace pair system of claim 1, further comprising:
    a third conductive layer that is included in the board and spaced apart from the differential trace pair opposite the differential trace pair from the second conductive layer, wherein the third conductive layer defines a third conductive layer opening that extends through the third conductive layer; and
    a fourth conductive layer that is included in the board and spaced apart from the third conductive layer opposite the third conductive layer from the differential trace pair.

5. The differential trace pair system of claim 4, wherein the first portion of the second differential trace is configured to reference to the fourth conductive layer through the third conductive layer opening.

6. The differential trace pair system of claim 1, further comprising:
    a solo trace that is included in the board and spaced apart from the second conductive layer and the differential trace pair, wherein the solo trace is configured to reference to the second conductive layer along an entire length of the solo trace.

7. An information handling system (IHS), comprising:
    a board;
    a processing system mounted to the board;
    a first conductive layer that is included in the board;
    a second conductive layer that is included in the board and spaced apart from the first conductive layer, wherein the second conductive layer defines a second conductive layer opening that extends through the second conductive layer; and
    a differential trace pair that is included in the board, coupled to the processing system, and spaced apart from the second conductive layer opposite the second conductive layer from the first conductive layer, wherein differential trace pair includes:
        a first differential trace that is configured to reference to the second conductive layer; and
        a second differential trace that includes a first portion that is configured to reference to the first conductive layer through the second conductive layer opening, wherein the referencing to the first conductive layer increases a propagation speed of a first signal transmitted through the first portion of the second differential trace relative to the propagation speed of the first signal transmitted through a second portion of the second differential trace that is configured to reference to the second conductive layer.

8. The IHS of claim 7, wherein the increase of the propagation speed of the first signal through the first portion of the second differential trace is configured to provide a predetermined phase mismatch with a second signal that is transmitted through the first differential trace.

9. The IHS of claim 7, wherein the first differential trace includes a serpentine region having:
- a first serpentine region portion in which the first differential trace and the second differential trace are substantially parallel and spaced part by a first differential trace pair spacing;
- a second serpentine region portion that is coupled to the first serpentine region portion and in which the first differential trace and the second differential trace are substantially parallel and spaced part by a second differential trace pair spacing that is greater than the first differential trace pair spacing; and
- a third serpentine region portion that is coupled to the second serpentine region portion and in which the first differential trace and the second differential trace are substantially parallel and spaced part by the first differential trace pair spacing.

10. The IHS of claim 7, further comprising:
- a third conductive layer that is included in the board and spaced apart from the differential trace pair opposite the differential trace pair from the second conductive layer, wherein the third conductive layer defines a third conductive layer opening that extends through the third conductive layer; and
- a fourth conductive layer that is included in the board and spaced apart from the third conductive layer opposite the third conductive layer from the differential trace pair.

11. The IHS of claim 10, wherein the first portion of the second differential trace is configured to reference to the fourth conductive layer through the third conductive layer opening.

12. The IHS of claim 7, further comprising:
- a solo trace that is included in the board and spaced apart from the second conductive layer and the differential trace pair, wherein the solo trace is configured to reference to the second conductive layer along an entire length of the solo trace.

13. A method for transmitting a signal, comprising:
- transmitting a signal via a differential trace pair that is included in a board, wherein the signal includes:
  - a first signal portion that is transmitted via a first differential trace in the differential trace pair; and
  - a second signal portion that is transmitted via a second differential trace in the differential trace pair;
- referencing, by the first differential trace while transmitting the first signal portion, to a first conductive layer that is included in the board and spaced apart from the differential trace pair; and
- referencing, by a first portion of the second differential trace while transmitting the second signal portion, to a second conductive layer that is included in the board and spaced apart from the first conductive layer opposite the differential trace pair, wherein the first portion of the second differential trace references to the second conductive layer through a first conductive layer opening that extends through the first conductive layer, wherein the referencing to the first conductive layer increases a propagation speed of the second signal portion transmitted through the first portion of the second differential trace relative to the propagation speed of the second signal portion transmitted through a second portion of the second differential trace that reference to the first conductive layer.

14. The method of claim 13, wherein the increase of the propagation speed of the second signal portion through the first portion of the second differential trace causes the second signal portion to have a predetermined phase mismatch with the first signal portion transmitted through the first differential trace.

15. The method of claim 13, wherein the first differential trace includes a serpentine region having:
- a first serpentine region portion in which the first differential trace and the second differential trace are substantially parallel and spaced part by a first differential trace pair spacing;
- a second serpentine region portion that is coupled to the first serpentine region portion and in which the first differential trace and the second differential trace are substantially parallel and spaced part by a second differential trace pair spacing that is greater than the first differential trace pair spacing; and
- a third serpentine region portion that is coupled to the second serpentine region portion and in which the first differential trace and the second differential trace are substantially parallel and spaced part by the first differential trace pair spacing.

16. The method of claim 13, further comprising:
- referencing, by the first differential trace while transmitting the first signal portion, to a third conductive layer that is included in the board and spaced apart from the differential trace pair opposite the differential trace pair from the first conductive layer; and
- referencing, by the first portion of the second differential trace while transmitting the second signal portion, to a fourth conductive layer that is included in the board and spaced apart from the third conductive layer opposite the third conductive layer from the differential trace pair, wherein the first portion of the second differential trace references to the fourth conductive layer through a third conductive layer opening that extends through the third conductive layer.

17. The method of claim 13, further comprising:
- referencing, by a solo trace that is included in the board and spaced apart from the first conductive layer and the differential trace pair, to the first conductive layer along an entire length of the solo trace.

* * * * *